United States Patent [19]
Ototake et al.

[11] Patent Number: 5,459,577
[45] Date of Patent: Oct. 17, 1995

[54] METHOD OF AND APPARATUS FOR MEASURING PATTERN POSITIONS

[75] Inventors: Taro Ototake, Tokyo; Takashi Endo, Yokohama; Hisao Izawa, Kawasaki; Kazuhiro Takaoka, Yokohama, all of Japan

[73] Assignee: Nikon Corporation, Tokyo, Japan

[21] Appl. No.: 310,987

[22] Filed: Sep. 23, 1994

Related U.S. Application Data

[63] Continuation of Ser. No. 67,062, May 26, 1993, abandoned.

[30] Foreign Application Priority Data

Jun. 1, 1992  [JP]  Japan ................................. 4-140501
Jul. 3, 1992  [JP]  Japan ................................. 4-176879

[51] Int. Cl.$^6$ ................................................. G01B 11/30
[52] U.S. Cl. ........................ 356/371; 250/559.29; 356/375
[58] Field of Search ............................ 356/401, 371, 356/375; 250/561

[56] References Cited

U.S. PATENT DOCUMENTS 4,730,927  3/1988  Ototake et al. ..................... 356/401
5,085,517  2/1992  Chadwick et al. ................. 356/394

*Primary Examiner*—F. L. Evans
*Attorney, Agent, or Firm*—Shapiro and Shapiro

[57] ABSTRACT

A pattern position measuring method measures two-dimensional positions of a hyperfine pattern formed on the surface of a substrate. This method comprises a pattern position measuring step of measuring the positions of the pattern in a first flexural configuration produced in a supported state where the measured substrate is supported in first a plurality of positions of the measured substrate on a stage, a flexural configuration detecting step of detecting the first flexural configuration of the surface of the measured substrate, and a correcting step of correcting the pattern positions in the first flexural configuration that are measured by the pattern position measuring step to pattern positions in a second flexural configuration on the basis of the pattern positions in the first flexural configuration that are measured by the pattern position measuring step, the first flexural configuration detected by the flexural configuration detecting step and the previously stored second flexural configuration of the surface of the measured substrate which is produced when the measured substrate is supported in a second plurality of positions different from the first plurality of positions.

20 Claims, 11 Drawing Sheets

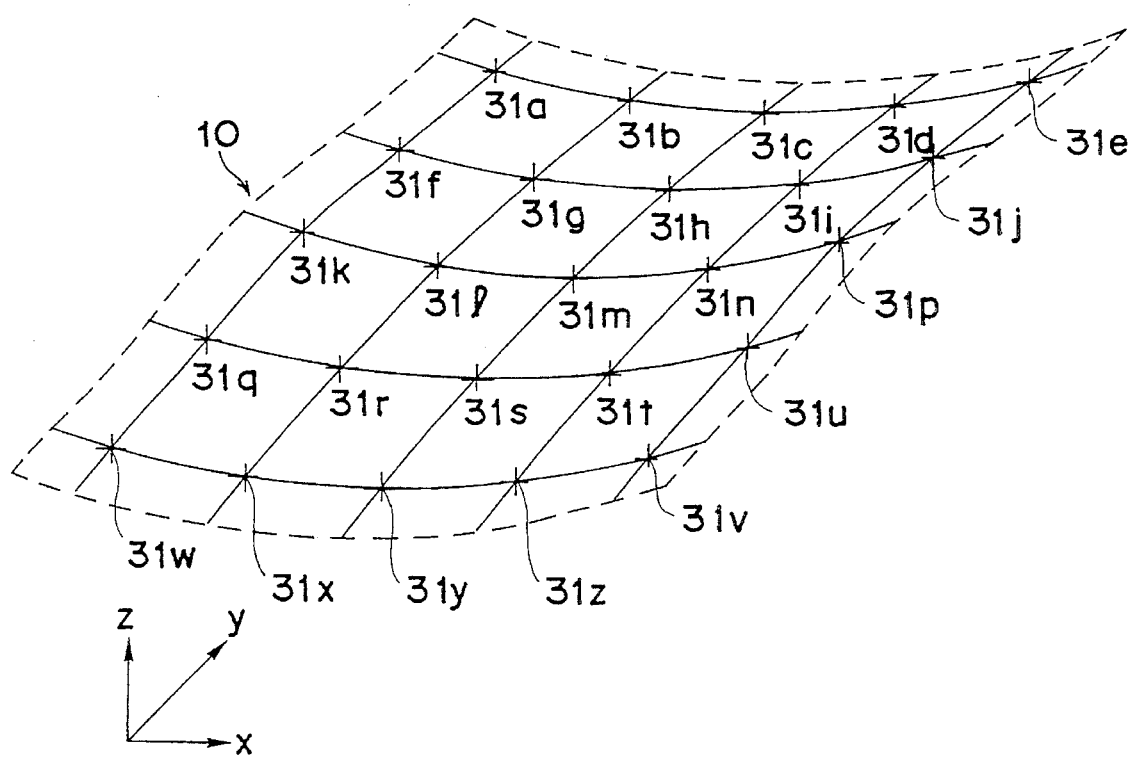
F I G. 5

METHOD OF AND APPARATUS FOR MEASURING PATTERN POSITIONS

This is a continuation of application Ser. No. 08/067,062 filed May 26, 1993, now abandoned.

BACKGROUND OF THE INVENTION

1. Field of the Invention

The present invention relates to a method of and an apparatus for measuring positions of a pattern formed on a substrate such as a photomask or a reticle.

2. Related Background Art

According to a conventional pattern position measuring apparatus, a measured substrate having its surface formed with a pattern is supported on support parts disposed in four positions on a stage. The measured substrate is adsorptively supported with its pattern forming surface being directed upward. Pattern edges are detected while moving the stage two-dimensionally. At the same time, two-dimensional positions of the stage are read from interferometers, thus measuring the pattern positions.

The measured substrate supported on the stage is, however, flexed by its tare weight. When supported on the stage with its pattern forming surface being directed upward, the pattern forming surface is shrunk. The conventional apparatus is therefore incapable of measuring only the pattern positions in a shrunk state of the pattern forming surface.

Under such circumstances, according to a pattern position measuring apparatus disclosed in U.S. Pat. No. 4,730,927, slopes of the surface of the substrate in the measured pattern positions are obtained. Computed are two-dimensional displacement quantities of the pattern positions that are caused due to these slopes. The measured pattern positions are corrected to pattern positions in a flat state.

Given herein is a brief explanation of a flexure correcting method disclosed in U.S. Pat. No. 4,730,927.

FIG. 12 is a view illustrating a supported state of the substrate in the conventional pattern position measuring apparatus. Support parts $3a$, $3b$, $3c$, $3d$ are provided in four positions on a stage 2. A substrate 90 is drawn to the support parts $3a$, $3b$, $3c$, $3d$. FIG. 13 is an enlarged sectional view taken substantially along the arrowed lines 13—13' in FIG. 12. The substrate 90 is, as illustrated in FIG. 13, flexed downward by its tare weight. The pattern forming surface is slightly shrunk.

A correction of the two-dimensional displacement quantities of the pattern positions involves the step of at first measuring heights of a pattern position 92a on the surface of the substrate 90 and of substrate surface positions 93, 94 in the vicinity thereof from a reference plane (e.g., a moving horizontal plane of the stage). An X-directional slope θ in the pattern position 92a is given in approximation such as:

$$\theta = \tan^{-1}\left[\{(W_1-W_0)/l+(W_2-W_0)/l\}/2\right]$$

where $W_0$ is the height of the pattern position 92a from the reference plane, $W_1$, $W_2$ are the heights of the substrate surface positions 93, 94 in the vicinity thereof from reference plane, and $l$ is the spacing between the respective positions in the horizontal direction. The slope of the substrate surface in the pattern position 92a is equal to a slope of a neutral surface 91 in a vertical downward position 92b aligned with the pattern position 92a. Hence, an X-directional displacement quantity of the pattern position 92a due to the slope θ of the surface of the substrate 90 can be obtained by:

$$(1/2) \times t \times \theta$$

where $t$ is the thickness of the substrate 90.

Similarly, a Y-directional displacement thereof is obtained.

The measured position of the pattern 92a in the shrunk state of the pattern forming surface is corrected to a pattern position in the ideal flat state in accordance with the thus computed X- and Y-directional displacement quantities.

There arises the following problem inherent in the prior art described above. Detected are only the pattern position in the shrunk state of the surface (pattern forming surface) of the measured substrate and the pattern position in the ideal flat state with no flexure and no deformation. For instance, in a semiconductor aligner using a reticle, the reticle is supported with its pattern forming surface set downward. It therefore follows that the pattern forming surface elongates reversely when supported on the pattern position measuring apparatus. The conventional apparatus is incapable of detecting the pattern positions when supported on the semiconductor aligner.

Another problem peculiar to the prior art described above is a decline of throughput. It is because the heights of the pattern measuring position and the positions vicinal thereto have to be respectively measured.

It is a first object of the present invention, which has been devised in view of the foregoing problems inherent in the above-mentioned prior art, to provide a pattern position measuring apparatus capable of correcting the measured pattern position to pattern positions in a variety of flexural states in different support modes.

It is a second object of the present invention to provide a pattern position measuring apparatus capable of exhibiting a high throughput.

SUMMARY OF THE INVENTION

To accomplish the first object given above, according to one aspect of the invention, there is provided a pattern position measuring method of measuring two-dimensional positions of a hyperfine pattern formed on the surface of a substrate to be measured, comprising the steps of measuring the pattern positions in a first flexural configuration produced in a state where the measured substrate is supported in a plurality of positions of the measured substrate on a stage; detecting the first flexural configuration of the surface of the measured substrate; and correcting the measured pattern positions in the first flexural configuration to pattern positions in a second flexural configuration on the basis of the measured pattern positions in the first flexural configuration, the first flexural configuration detected and the previously stored second flexural configuration of the surface of the measured substrate which is produced when the measured substrate is supported in a plurality of positions different from the plurality of positions described above.

Further, to accomplish the first object given above, according to another aspect of the invention, there is provided a pattern position measuring apparatus for measuring two-dimensional positions of a hyperfine pattern formed on the surface of a substrate to be measured, the apparatus comprising: a pattern position measuring means for measuring the pattern positions in a first flexural configuration produced in a supported state where the measured substrate is supported in a plurality of positions of the measured substrate on a stage; a flexural configuration detecting means for detecting the first flexural configuration of the surface of the measured substrate; a storing means for storing a second flexural configuration of the surface of the measured substrate that is produced when the measured substrate is supported in a plurality of positions different from the foregoing plurality of positions; and a correcting means for correcting the pattern positions in the first flexural configuration that are measured by the pattern position measuring means to pattern positions in a second flexural configuration on the basis of the pattern positions in the first flexural configuration that are measured by the pattern position measuring means, the first flexural configuration detected by the flexural configuration detecting means and the second flexural configuration stored in the storing means.

The pattern positions in the first flexural configuration of the surface of the measured substrate which is produced when the measured substrate is supported in the plurality of positions of the substrate are corrected to the pattern positions in the ideal flat state with no flexure. The correction quantities for this correction are, as described above, computed in approximation by $(t\theta/2)$, where $\theta$ is the slope of the substrate surface in the pattern position in the first flexural configuration, and t is the thickness of the substrate. The pattern positions in the second flexural configuration of the surface of the measured substrate that is produced when supported in a plurality of positions different from the foregoing plurality of positions are corrected to the pattern positions in the ideal flat state with no flexure. Thus, the correction quantities for this correction are computed in approximation by $(t\theta'/2)$, where $\theta'$ is the slope in the pattern position in the second flexural configuration, and t is the thickness of the substrate. Namely, if the second configuration is known, the pattern positions in the first flexural configuration can be corrected to the pattern positions in the second flexural configuration.

According to the pattern position measuring method and apparatus of the present invention, there is previously stored the second flexural configuration of the surface of the measured substrate which is produced when the measured substrate is supported in the plurality of positions different from the support positions on the stage. It is therefore possible to immediately correct, to the pattern positions in the second flexural configuration, the pattern positions in the first flexural configuration of the surface of the measured substrate that is produced when the measured substrate is supported on the stage.

Stored is the flexural configuration (second flexural configuration) produced when, for instance, the measured substrate is supported on the stage with its pattern forming surface being directed downward. Thus, the measured results can be immediately corrected to the pattern positions in the second flexural configuration by measuring the pattern positions in the first flexural configuration that is produced when the measured substrate is supported on the stage with the surface being set upward.

To accomplish the second object, according to still another aspect of the invention, there is provided a pattern position measuring method of measuring two-dimensional positions of a hyperfine pattern formed on the surface of a substrate to be measured, the method comprising the steps of: measuring the two-dimensional positions of the pattern; and correcting the measured pattern positions to pattern positions in a state of causing no flexure by a tare weight in accordance with previously stored two-dimensional displacement quantities of the pattern positions that are produced by a flexure due to the tare weight of a substrate having the same material and shape as those of the measured substrate.

Moreover, to accomplish the second object, according to a further aspect of the invention, there is provided a pattern position measuring apparatus for measuring two-dimensional positions of a hyperfine pattern formed on the surface of a substrate to be measured, the apparatus comprising: a pattern position measuring means for measuring the two-dimensional pattern positions; a storing means for storing two-dimensional displacement quantities of the pattern positions that are produced by a flexure due to a tare weight of a substrate having the same material and shape as those of the measured substrate; and a correcting means for correcting the pattern positions measured by the pattern position measuring means in accordance with the displacement quantities stored in the storing means.

When the substrate is supported without being drawn to substrate supports, the drawn parts of the substrate are not locally distorted. If materials and shapes of the substrates are identical with each other, the caused-by-tare-weight flexure quantities of the substrates are the same.

FIG. 11 illustrates respective flexural configurations based on results of actually measuring the flexural configurations of the surfaces of two pieces of substrates 71 (solid line), 72 (dotted line) having the same material (quartz) and shape (6 inches in square, 0.12 inch in thickness) when supported in three positions on the stage without being drawn to the substrate supports. As can be understood from FIG. 11, a difference in the flexure quantity between the two substrates is 0.52 μm at the maximum. It can be known that the flexural configurations of the two substrates are substantially identical.

Accordingly, if the materials and shapes of the substrates are identical with each other, the two-dimensional displacement quantities of the pattern positions that are caused by the flexures due to the tare weights of the substrates are also the same.

According to the pattern position measuring method and apparatus of the present invention, there are previously stored the two-dimensional displacement quantities of the pattern positions that are caused by the flexure due to the tare weight of the substrate having the same material and shape as those of the measured substrate. The measured pattern positions in a caused-by-tare-weight flexed state can be immediately corrected to the pattern positions in the state exhibiting no flexure due to the tare weight.

That is, there is no necessity for computing the two-dimensional displacement quantities of the pattern positions that are produced by the slopes obtained in the pattern positions as done in the prior art. The throughput can be thereby improved.

BRIEF DESCRIPTION OF THE DRAWINGS

Other objects and advantages of the present invention will become apparent during the following discussion in conjunction with the accompanying drawings, in which:

FIG. 5 is a diagram showing one example of a flexural configuration of a pattern forming surface of the substrate that is obtained by an approximate expression;

DESCRIPTION OF THE PREFERRED EMBODIMENTS

A first embodiment of the present invention will hereinafter be described in detail with reference to the drawings.

Figure 1:
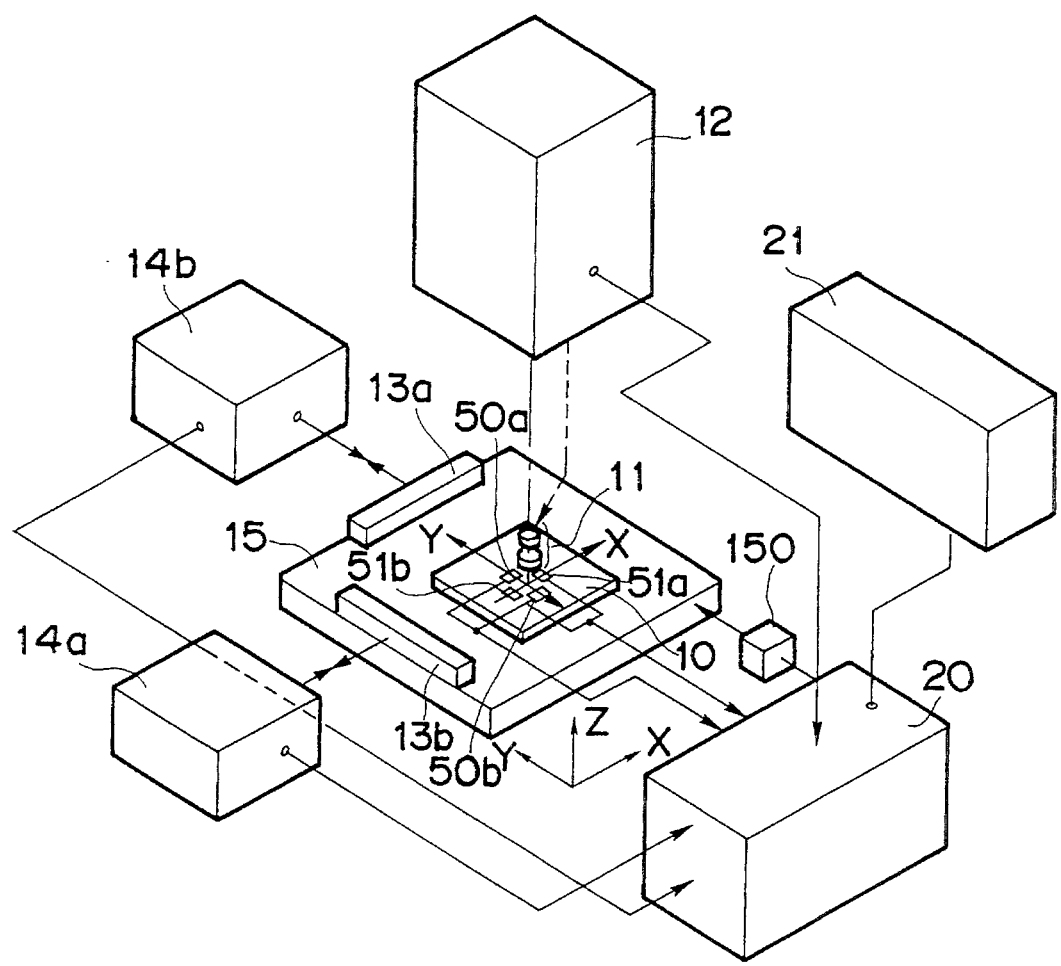
FIG. 1 is a perspective view schematically showing a construction of a pattern position measuring apparatus in a first embodiment of the present invention.
Figure 2:
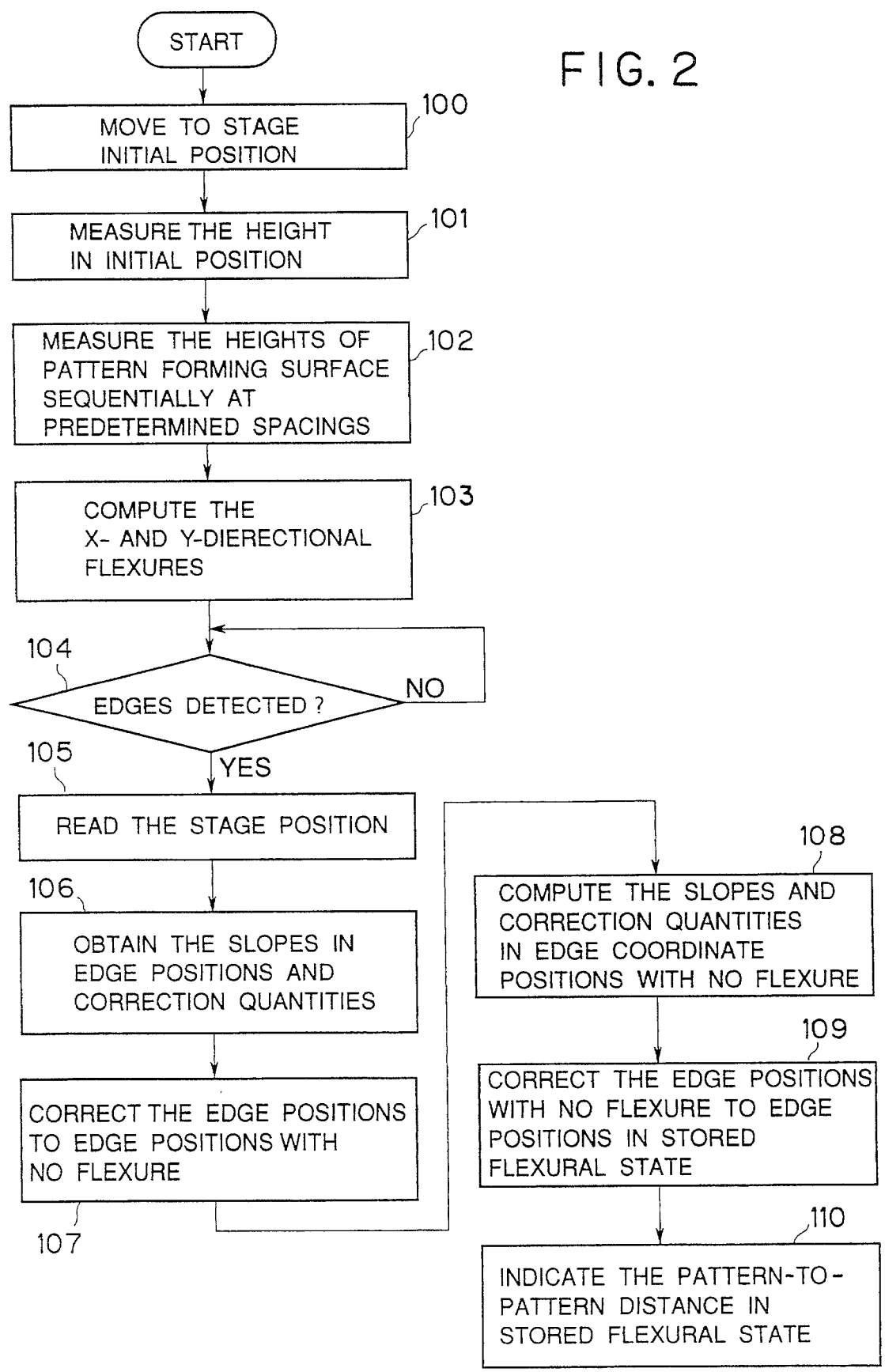
FIG. 2 is a flowchart showing operations of a main control unit 20 employed in the pattern position measuring apparatus shown in FIG. 1.

FIG. 1 is a schematic view illustrating a construction of an apparatus for measuring pattern positions in accordance with the first embodiment of this invention. FIG. 2 is a flowchart showing operations of a main control unit 20 illustrated in FIG. 1. A predetermined hyperfine pattern is formed on a substrate 10 to be measured such as a photomask or a reticle. The measured substrate 10 is supported, with its surface (pattern forming surface) being directed upward, on an XY stage 15. A pattern image thereof is enlarged by an objective lens 11 and formed in a predetermined position within an optical device 12. A laser light source (unillustrated) is incorporated into this optical device 12. A laser spot is projected on the measured substrate 10 via the objective lens 11. Generally, the pattern formed on the photomask or the reticle has microscopic rugged edges. Consequently, when effecting relative scanning by spot beams, it follows that the light is scattered or diffracted at the edges. Disposed in the circumference of the objective lens 11 are four photodetectors 50a, 50b, 51a, 51b functioning as edge detecting means for receiving the scattered light or the like. This edge detecting method is fully disclosed in U.S. Pat. No. 4,112, 309, and the explanation will be therefore omitted. Further, the optical device 12 includes a means for detecting an in-focus state of the objective lens 11. The objective lens 11 is moved up and down in directions Z, whereby autofocusing can be performed on the surface of the measured substrate. Herein, the detection of an in-focus position by the focus detecting means will be briefly explained. To start with, the laser beam is projected spotwise (or slitwise) to form an image on the measured substrate 10 through the object lens 11. The light reflected by the measured substrate 10 is again image-formed via the objective lens 11. At the same time, a simple harmonic motion of position of a pinhole (or slit) is caused in the optical-axis direction (direction Z), with a predetermined in-focus plane being centered. Further, an output signal obtained by receiving the light penetrating the pinhole (or slit) undergoes a synchronous detection (synchronous rectification) at a frequency of the simple harmonic motion. Obtained as a result of this is an S-curve signal shown in FIG. 3, wherein a voltage value with respect to a position in the direction Z varies in an S-shape.

This S-curve signal exhibits such characteristics that a defocus quantity d and a voltage value V each have a linearity in small sections in front and in rear of an in-focus position $d_0$, and the voltage value V comes to zero in the in-focus position $d_0$. It is therefore possible to easily detect a Z-directional height of the surface of the measured substrate 10 with respect to the in-focus position $d_0$ on the basis of the S-curve signal, i.e., a spacing between the surface of the measured substrate 10 and an ideal movement horizontal plane (reference plane) of the XY stage 15 which moves two-dimensionally while being mounted with the measured substrate 10.

The XY stage 15 mounted with the measured substrate 10 is two-dimensionally moved on an X–Y plane (reference plane) by means of an actuator 150 including a motor or the like.

X- and Y-axis interferometer systems 14a, 14b irradiate, with length measuring beams, the reflection surfaces of movable mirrors 13a, 13b fixed to edges of the upper surface of the XY stage 15. Positions of the XY stage 15, i.e., positions (coordinates) on the X–Y plane of the surface of the measured substrate 10 existing on the optical axis of the objective lens 11, are detected. Signals indicating the detected positions are inputted to the main control unit 20.

Inputted to the main control unit 20 are a signal corresponding to the in-focus state which is transmitted from the focus detecting means, positional signals from the X- and Y-axis interferometer systems 14a, 14b and edge detection signals from the photodetectors 50a, 50b, 51a, 51b. The main control unit 20 then outputs a control signal to the actuator 150.

In accordance with this embodiment, the main control unit 20 for controlling the whole apparatus incorporates a microcomputer and the following six programmed functions.

A first function is intended to detect a height of the surface of the measured substrate. More specifically, the XY stage 15 is two-dimensionally moved stepwise at predetermined intervals by inputting the control signals to the actuator 150 while monitoring the respective X- and Y-axis positional signals transmitted from the X- and Y-axis interferometer systems 14a, 14b. Output signals (outputs before autofocusing) of the focus detecting means of the optical device 12 are read in twenty five stop positions (hereinafter referred to as height measuring points) 31a–31e, 31f–31j, 31k–31p, 31q–31u, 31w–31v on the XY stage 15. The z-directional height of the surface of the measured substrate 10 is detected based on a deviation from the in-focus position $d_0$ (zero in voltage value). Subsequently, the main control unit 20 stores this height value together with the coordinate values (corresponding to the positions of the surface of the measured substrate 10 on the optical axis of the objective lens 11) indicated by the positional signals given from the interferometer systems 14a, 14b.

A second function is to compute a first flexural configuration of the pattern forming surface in the form of functions of (x, y) by effecting an interpolation with respect to the height measuring points from a relationship between the coordinate values at the height measuring points and the height of the surface (pattern forming surface) of the measured substrate 10 which has been obtained at the height measuring points in accordance with the first function.

A third function is to compute slopes of the surface (pattern forming surface) of the measured substrate 10 in the positions (pattern positions) in which the edge signals are outputted from the photodetectors 50a, 50b, 51a, 51b in accordance with the first flexural configuration computed by the second function and to correct the pattern positions in the first flexural configuration to pattern positions in a planar state on the basis of the thus computed slopes.

A fourth function is to store, in the form of a biquadratic formula, a second flexural configuration of the pattern forming surface which is formed when supporting the measured substrate with the pattern forming surface being directed downward. The flexural configuration, stored herein, of the pattern forming surface is arithmetically obtained by use of the finite element method.

A fifth function is to correct, on the basis of the previously stored second flexural configuration, the pattern positions in the planar state with no flexure that have been obtained by the third function to pattern positions in the second flexural configuration.

A sixth function is a distance computing function to compute a pattern-to-pattern distance in the second flexural state from the pattern positions in the second flexural configuration that have been obtained based on the fifth function.

Figure 6A:
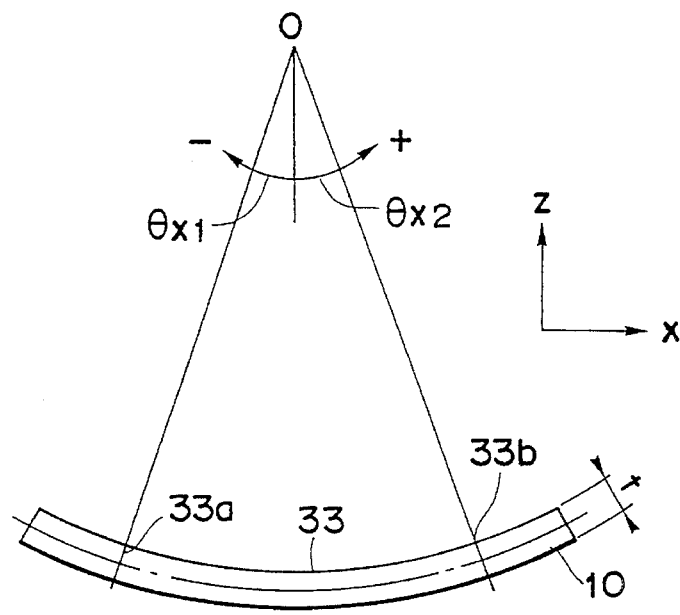
FIGS. 6A and 6B are diagrams each showing one example of an X-directional configuration in section of the substrate.

Operations of the pattern positions measuring apparatus in accordance with this embodiment shown in FIG. 1 will be explained with reference to FIGS. 2 and 4. Note that the explanation is given on the assumption that the measured substrate 10 is, as illustrated in FIG. 6A, flexed in a circular arc with a point O being centered.

The main control unit 20 issues a drive command to the actuator 150 so that the XY stage 15 comes to an initial position in conformity with a measurement start instruction given from an unillustrated input unit till stage position signals are generated which represent the initial position while monitoring the stage position signals from the X- and Y-axis interferometer systems 14a, 14b, respectively (step 100).

Figure 4:
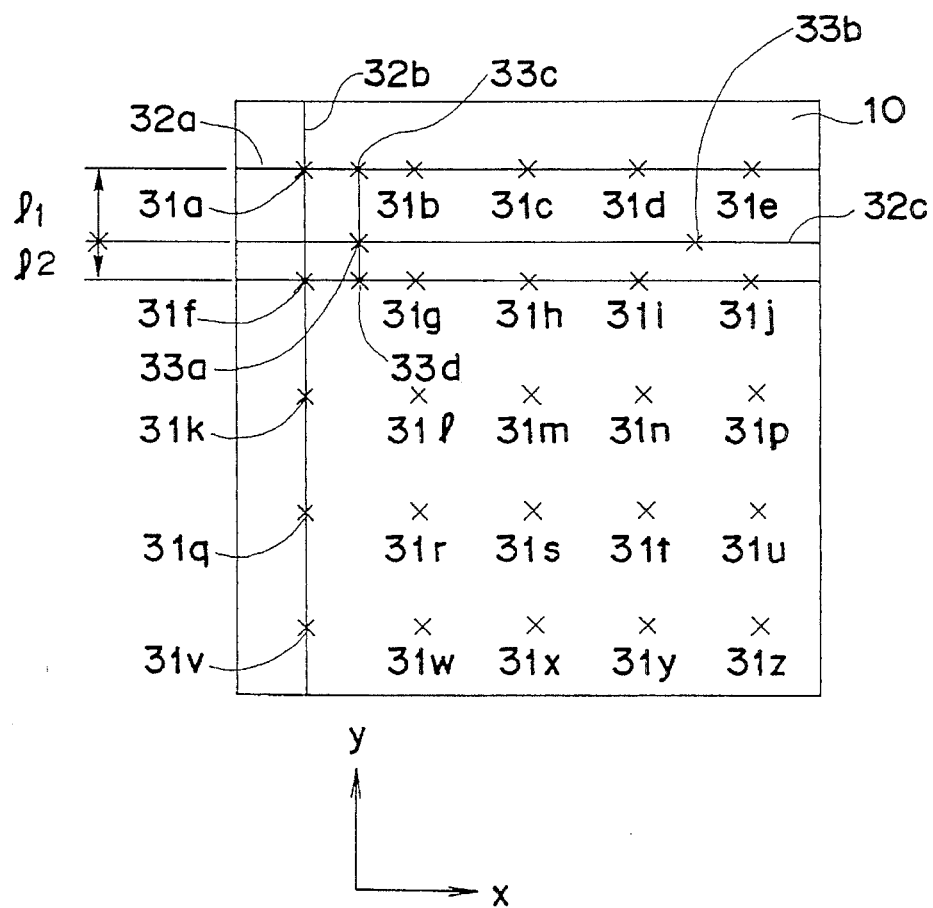
FIG. 4 is an explanatory diagram showing procedures for obtaining height measuring positions and slopes of a substrate.

As a result, the height measuring point 31a of the surface of the measured substrate shown in, e.g., FIG. 4, is on the optical axis of the objective lens 11 of the optical device 12. The main control unit 20 reads an output voltage before the autofocus of the focus detecting means of the optical device 12 works. The main control unit 20 thereby measures a height $H_{31}$ of the height measuring point 31a from the reference plane. The main control unit 20 stores the height $H_{31}$ as well as the coordinate values of the height measuring point 31a (step 101).

The main control unit 20 causes the XY stage 15 to move and sequentially measures heights $H_{31b}$~$H_{31z}$, from the reference plane, of the height measuring points 31b~31z of the surface of the measured substrate 10. The main control unit 20 stores these heights together with the coordinate values of the respective height measuring points (step 102).

Based on relationships between the heights of the height measuring points 31a~31e arranged in a direction X from the reference plane and the coordinate values of the respective height measuring points, the main control unit 20 subsequently approximates the flexural configuration on a line 32a in the direction X by the following biquadratic formula:

$$z = a_1 X^4 + a_2 X^3 + a_3 X^2 + a_4 X + a_5$$

The unknown for five pieces of data of z and X numbers 5 from $a_1$ to $a_5$, and, therefore, the biquadratic formula is univocally determined.

Obtained sequentially in this manner are biquadratic approximate expressions representing flexural configurations with respect to height measuring points 31f~31j in the direction X, height measuring points 31k~31p in the direction X, height measuring points 31q~31u in the direction X and height measuring points 31v~31z in the direction X.

Further, with respect to height measuring points 31a~31v arranged in a direction Y, the flexural configuration on a line 32b (see FIG. 4) in the direction Y is similarly approximated by the following biquadratic formula:

$$z = a_1 Y^4 + a_2 Y^3 + a_3 Y^2 + a_4 Y + a_5$$

Obtained sequentially in the same manner are biquadratic approximate expressions representing flexural configurations with respect to height measuring points 31b~31w in the direction Y, height measuring points 31c~31x in the direction Y, height measuring points 31d~31y in the direction Y and height measuring points 31e~31z in the direction Y (step 103).

The flexural configurations of the surface of the measured substrate are illustrated based on these approximate expressions in FIG. 5.

Next, the main control unit 20 moves the XY stage back to the initial position and thereafter controls the actuator 150. The XY stage 15 is thereby moved stepwise from the initial position. Relative scanning is effected by use of the spot beams emitted from the optical device 12. Then, the edge detection signals are outputted from the photodetectors 50a, 50b, 51a, 51b (step 104).

Subsequently, the main control unit 20 reads coordinate values of the XY stage 15 when outputting the edge detection signals from the positional signals of the interferometer systems 14a, 14b at the time of detecting the pattern edges (step 105).

For instance, it is now assumed that the edge detection signals are outputted in positions 33a, 33b of the pattern edges (hereinafter called pattern positions) in FIG. 4. Coordinate values of the pattern positions 33a, 33b are read from the interferometer systems 14a, 14b and then stored.

The main control unit 20 computes X-directional slopes $\theta_{x3}$, $\theta_{x4}$ in positions 33c, 33d existing pursuant to the approximate expressions adjacent to the pattern position 33a and having X-coordinate values equal to the X-coordinate value of the pattern position 33a. The slopes $\theta_{x3}$, $\theta_{x4}$ can be obtained by differentiating the previously computed biquadratic expressions and substituting the X-coordinate values thereinto.

In accordance with the proportional distribution, the X-directional slope $\theta_{x1}$ in the pattern position 33a is given by:

$$\theta_{x1} = (l_2 \theta_{x3} + l_1 \theta_{x4})/(l_1 + l_2)$$

where $l_1$ is the distance between the pattern positions 33a and 33c, and $l_2$ is the distance between the pattern positions 33a and 33d (see FIG. 4).

The other X-directional slope $\theta_{x2}$ in the pattern position 33b is also similarly computed.

Further, Y-directional slopes $\theta_{y1}$, $\theta_{y2}$ are also computed in the same way.

Subsequently, correction quantities $(t\theta_{x1}/2)$, $(t\theta_{y1}/2)$, $(t\theta_{x2}/2)$, $(t\theta_{y2}/2)$ in the pattern positions 33a, 33b are respectively computed based on the slopes $\theta_{x1}$, $\theta_{x2}$ in the pattern positions (step 106), where t is the thickness of the measured substrate 10.

The coordinate values of the pattern positions detected by the interferometer systems 14a, 14b are corrected to coordinate values of the pattern positions in the non-flexural state by use of these correction quantities (step 107).

Correction quantities in the direction Y may be conceived similarly.

The thus obtained pattern positions are very approximate to the pattern positions in the state where the pattern forming surface of the measured substrate 10 is not flexed.

Figure 6B:
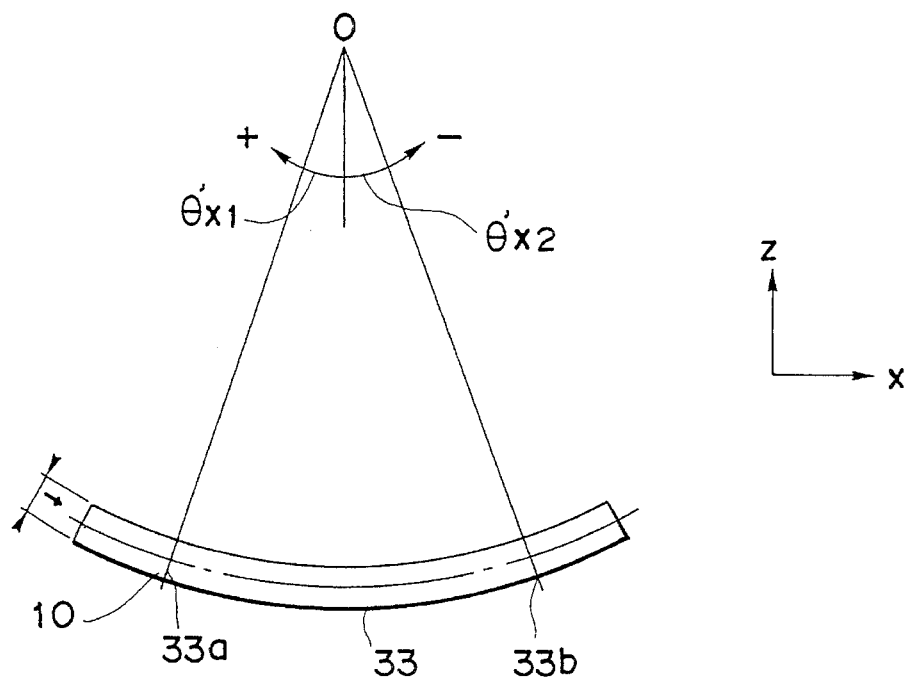

Based on the biquadratic approximate expressions in the second flexural configuration stored beforehand as follows, the main control unit 20 next corrects the pattern positions in the non-flexural state to pattern positions in the second flexural configuration. Note that the previously stored second flexural configuration is, as illustrated in FIG. 6B, given on the assumption that the measured substrate 10 is flexed in the circular arc with a point O' being centered.

Slopes $\theta_{x1}'$, $\theta_{x2}'$, $\theta_{y1}'$, $\theta_{y2}'$ in the pattern positions in the non-flexural state are computed by use of the above-mentioned proportional distribution. Further, correction quantities $(t\theta_{x1}'/2)$, $(t\theta_{y1}'/2)$, $(t\theta_{x2}'/2)$, $(t\theta_{y2}'/2)$ are computed (step 108).

The corresponding coordinate values of the pattern positions in the non-flexural state are corrected by using these correction quantities to the coordinate values of the pattern positions 33a, 33b in the second flexural configuration caused when supported with the pattern forming surface being directed downward (step 109).

The thus obtained pattern positions are approximate to the pattern positions when the measured substrate 10 is supported with the pattern forming surface being directed downward.

It can be understood that a distance between the pattern positions 33a, 33b in the flexural state shown in FIG. 6A has a difference on the order of $t(\theta_{x1}-\theta_{x2})/2$ as compared with a distance between the pattern positions 33a and 33b when placed in a state of the ideal plane of the measured substrate 10. However, the slopes $\theta_{x1}$, $\theta_{x2}$ are positive if the measured substrate 10 is inclined upward to the right hand as illustrated in FIGS. 6A and 6B but negative if inclined upward to the left hand. In this case, it follows that the distance between the pattern positions 33a and 33b is measured long if a slope difference given by $(\theta_{x1}-\theta_{x2})$ is positive but measured short if $(\theta_{x1}-\theta_{x2})$ is negative. Further, even if the measured substrate 10 is inclined to the horizontal plane, an error is computed from the difference between $\theta_{x1}$ and $\theta_{x2}$. The inclination is therefore canceled.

It can be also understood that a distance between the pattern positions 33a, 33b in the flexural state shown in FIG. 6B has a difference on the order of $t(\theta_{x1}'-\theta_{x2}')/2$ as compared with a distance between the pattern positions 33a and 33b in the non-flexural state of the measured substrate 10. However, the slopes $\theta_{x1}'$, $\theta_{x2}'$ are positive if the measured 10 substrate 10 is inclined upward to the left hand as illustrated in FIGS. 6A and 6B but negative if inclined upward to the right hand. In this case, it follows that the distance between the pattern positions 33a and 33b is measured long if a slope difference given by $(\theta_{x1}'-\theta_{x2}')$ is positive but measured short if $(\theta_{x1}'-\theta_{x2}')$ is negative. Further, even if the measured substrate 10 is inclined to the horizontal plane, an error is computed from the difference between $\theta_{x1}'$ and $\theta_{x2}'$. The inclination is therefore canceled.

It is therefore possible to immediately obtain the distance between the pattern positions 33a and 33b in the second flexural configuration when the measured substrate 10 is supported with its pattern forming surface being directed downward when $(t(\theta_{x1}-\theta_{x2})/2)-(t(\theta_{x1}'-\theta_{x2}')/2)$ is considered.

The main control unit 20 obtains a pattern-to-pattern distance in the second flexural configuration produced when supported with the pattern forming surface being directed downward on the basis of the pattern positions in the second flexural configuration obtained with the correction described above. The main control unit 20 causes an indicator 21 to indicate this pattern-to-pattern distance (step 110).

In accordance with this embodiment, the second flexural configuration stored in the main control unit 20 is obtained by the computation. However, a device other than the above-mentioned may store a flexural configuration measured when a measured substrate having the same material and shape as those of the measured substrate 10 is supported with its pattern forming surface being directed downward.

Stored in this embodiment is only the flexural configuration of the pattern forming surface when supported with the pattern forming surface being set downward. As a different supported state of the substrate, however, a flexural configuration of the pattern forming surface may be stored, wherein a support spacing and the number of supporting points of the substrate are different.

In accordance with this embodiment, the height of the surface of the substrate is measured at twenty five points. The number of measuring points is not limited to 25. In the case of reducing an approximation error of the flexure, the number of the measuring points may be increased. Note that, in this case, the degree of the approximate expression representing the flexural configuration is required to increase.

Further, the curved-surface may be approximated by a proper function defined such as $z=f(x, y)$ by way of a method of approximation representing the flexural configuration. In this instance, if the pattern edges are positioned anywhere, the slopes can be immediately obtained by differentiating the function and substituting the X- and Y-coordinate values thereinto without using the proportional distribution as required in the embodiment discussed above.

In accordance with this embodiment, the height of the surface of the measured substrate 10 is detected based on the signals outputted by the focus detecting means. This method is not, however, limitative. For example, quantities of the up-and-down motions of the objective lens 11 may be read by means of an encoder, an interferometer or a potentiometer, etc. Besides, there may be read not only the quantities of the up-and-down motions of the objective lens 11 but also quantities of up-and-down motions of a Z stage provided above the XY stage 15 and moving up and down in the Z direction.

Further, other edge detecting means may involve the use of, as a matter of course, a photoelectric microscope for scanning pattern edge images formed through the objective lens 11 by employing a slit or the like.

Moreover, the flexure of the measured sample is not limited to the circular arc shown in the embodiment. Even if deformed in any shape, the pattern positions may be of course corrected.

As discussed above, this embodiment provides the arrangement to previously store the second flexural configuration produced when supporting the measured substrate in a plurality of positions different from the plurality of on-stage positions. The pattern positions in the first flexural configuration can be therefore corrected at once to the pattern positions in the second flexural state on the basis of the pattern positions in the first and second flexural configurations caused when supporting the substrate in the plurality of positions of the measured substrate.

The following is a description of a second embodiment of the present invention.

Figure 7:
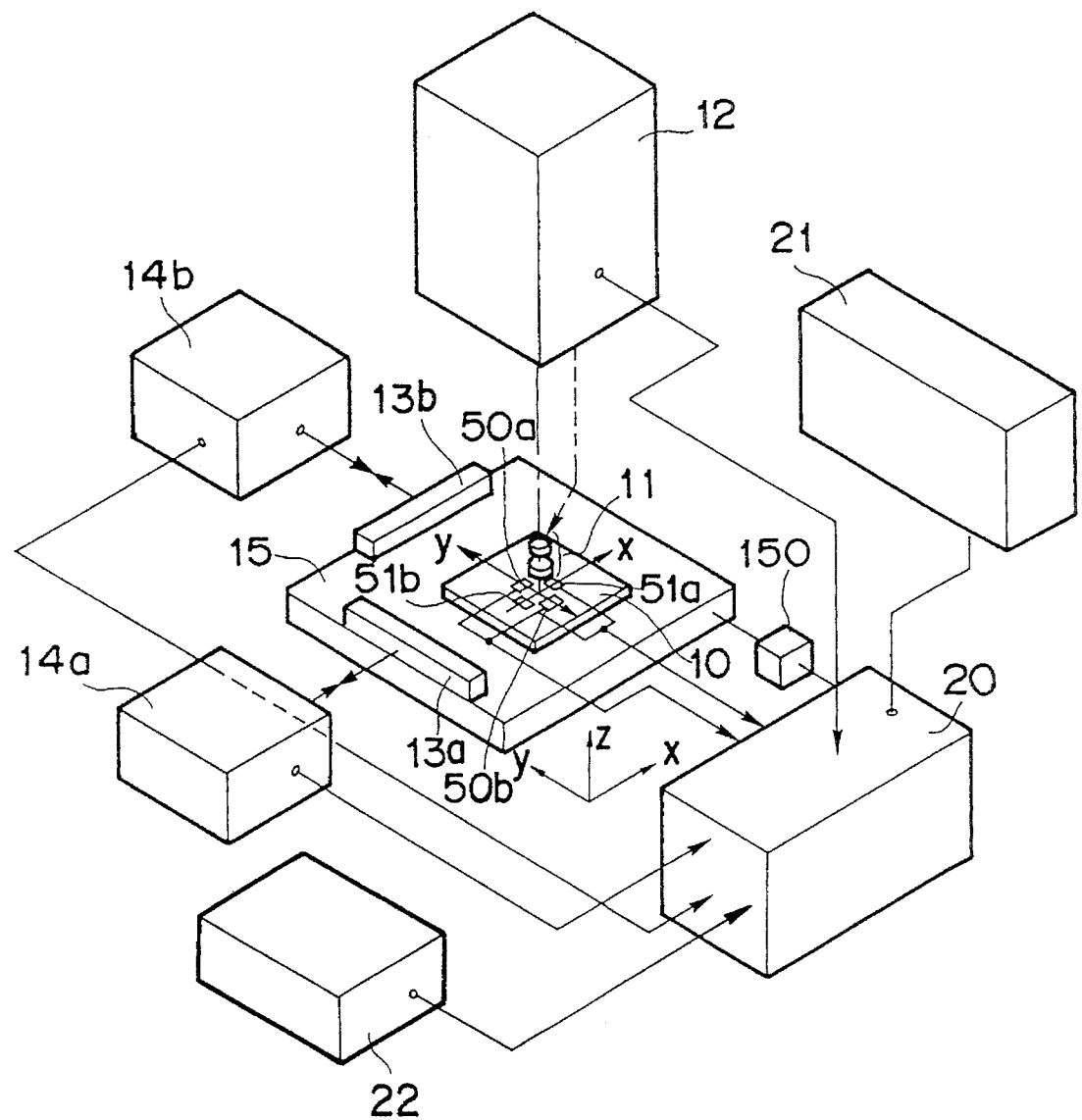
FIG. 7 is a view schematically illustrating a construction of the pattern position measuring apparatus in a second embodiment of the present invention.

FIG. 7 is a view schematically illustrating a construction of a pattern position measuring apparatus in the second embodiment of this invention. The members corresponding to those shown in FIG. 1 are marked with the same numerals as those in FIG. 1, and, therefore, the explanations thereof will be omitted. A different point of FIG. 7 from FIG. 1 is that a memory 22 is connected to the main control unit 20. Stored in the memory 22 are two-dimensional displacement quantities (correction quantities) of the pattern positions which are set at a plurality of points on the surface of the substrate 10 and attributed to a flexure caused by a tare weight. Incidentally, in accordance with this embodiment, the correction quantities stored in the memory 22 serve to correct the pattern positions in the flexed state due to the tare weight when supporting the measured substrate with its surface (pattern forming surface) being directed upward to pattern positions in a state where the flexure is not caused by the tare weight. Stored also in the memory 22 are correction quantities set, as illustrated in, e.g., FIG. 9, at twenty five points 9a–9z on the surface of the substrate.

In accordance with this embodiment, the main control unit 20 for controlling the operations of the whole apparatus incorporates a microcomputer and the following four functions programmed beforehand.

A first function is intended to detect a height of the surface of a reference substrate having the same material and shape as those of the measured substrate.

A second function is to detect a caused-by-tare-weight flexural configuration of the surface of the reference substrate on the basis of the result detected by the first function.

Note that the particulars of the first and second functions are the same as those in the first embodiment, and hence the explanations thereof will be omitted.

A third function is a displacement quantity computing function to compute displacement quantities of the pattern positions which are set at twenty five points on the reference substrate surface and derived from the caused-by-tare-weight flexure of the reference substrate on the basis of the result detected by the second function. The third function is also to make the memory 22 store the displacement quantities.

Figure 9:
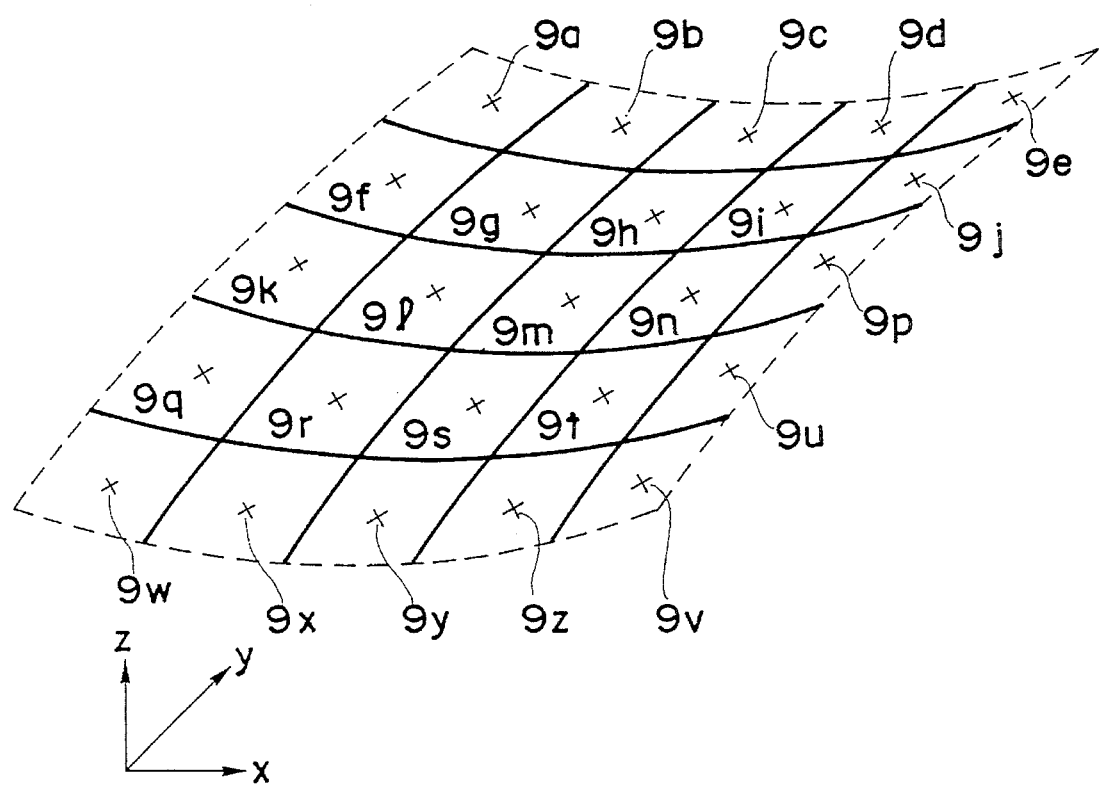
FIG. 9 is a diagram showing relationships between partitioned areas and positions on the substrate surface where correction quantities are prescribed.

A fourth function is to correct the measured pattern positions by reading the displacement quantities in areas where the edge-detected pattern exists from the memory 22 as well as to define twenty five areas on the surface of the measured substrate 10 as shown in FIG. 9 about the twenty five points 31a–31z where the displacement quantities are computed by the second function.

Figure 8A:
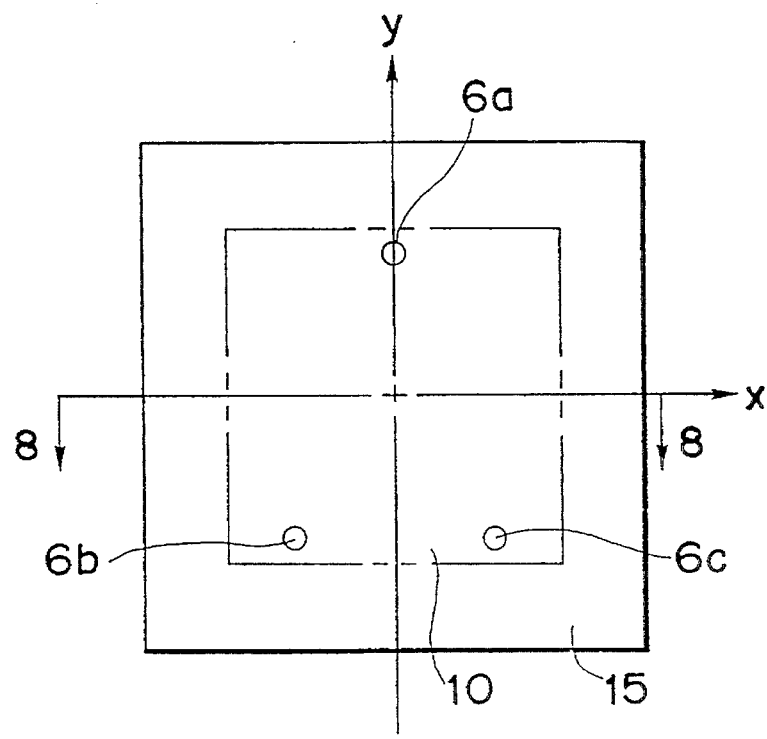
FIGS. 8A and 8B are enlarged views each showing a stage in the second embodiment of the present invention.
Figure 8B:
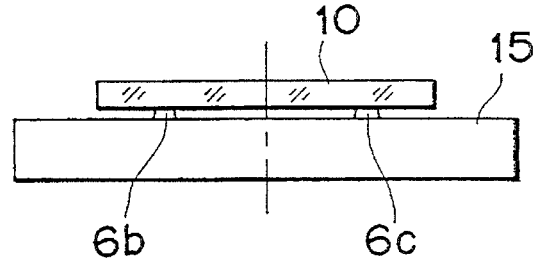

FIGS. 8A and 8B are enlarged views each schematically illustrating the stage 15 in this embodiment.

FIG. 8A is a plan view of the stage 15. FIG. 8B is a sectional view taken substantially along the arrowed line 8—8' in FIG. 8A. The measured substrate 10 such as a mask or a reticle has its surface formed with a predetermined hyperfine pattern. The substrate 10 is supported on substrate support parts 6a, 6b, 6c provided at three points on the stage 15. At this time, the substrate 10 is supported without being drawn to the substrate support parts 6a, 6b, 6c. If the substrate is supported without being drawn in this way, no partial flexure is caused in the substrate. This exhibits such an effect that a good reproducibility of the measured result is provided.

Given next is an explanation of operations of the thus constructed pattern position measuring apparatus in this embodiment.

The explanation begins with an operation of storage of the correction quantities into the memory 22 with reference to FIGS. 10A to 10D.

FIGS. 10A to 10D are sectional views each showing a reference substrate 200 having the same material and shape as those of the measured substrate, wherein the reference substrate 200 is supported on the three substrate support parts on the XY stage 15.

At the first onset, the reference substrate 200 is supported on the XY stage 15, with its surface being directed upward. At this time, the substrate is, as depicted by dotted lines in FIG. 10A, flexed by the tare weight. Solid lines in FIG. 10A indicate a state where the substrate is not flexed by the tare weight. The main control unit 20 detects a flexural configuration of the surface of the reference substrate supported with its surface being set upward by the first and second functions.

Next, the reference substrate 200 is supported on the XY stage 15 while inverting the surface and the underside thereof. In this supported state, the substrate is, as indicated by the dotted lines in FIG. 10B, flexed by the tare weight. Note that the solid lines in FIG. 10B depict a state where the substrate is not flexed by the tare weight. The main control unit 20 detects a flexural configuration of the underside of the reference substrate in a state where the reference substrate is supported with its surface being directed downward with the aid of the first and second functions.

Next, the main control unit 20 computes two-dimensional displacement quantities of the pattern positions which are produced by the flexure caused by the tare weight with the aid of the third function in the following manner.

Figure 3:
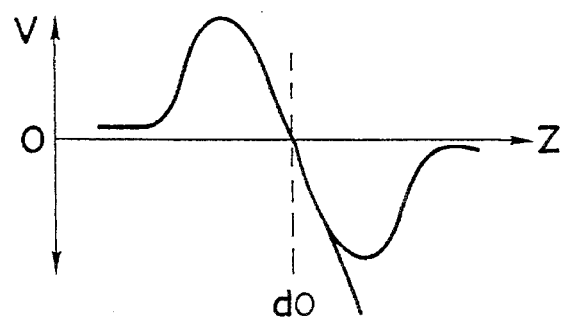
FIG. 3 is a view depicting a waveform of an S-curve signal outputted from a focus detecting means.

Firstly, the data are mirror-inverted from the data about the flexural configuration detected in the state shown in FIG. 3, thereby computing the data about the flexural configuration when supported with the surface being directed upward. A flexural state of the substrate is depicted based on such data in FIG. 10C. Averaged further are the data about the flexural configuration in FIG. 10A and the data about the flexural configuration in FIG. 10C. A flexural state of the substrate is depicted based on this average data as indicated by the dotted lines in FIG. 10D. The dotted lines in FIG. 10D indicate a state where the undeformed substrate is flexed by the tare weight. Slopes of the surface of the substrate are computed at a plurality of points from the data representing a state of the caused-by-tare-weight flexure of this undeformed substrate. Thus, there are computed two-dimensional displacement quantities (correction quantities) of the pattern positions which are produced by the slopes described above. Then, the computed correction quantities are stored in the memory 22.

Figure 10A:
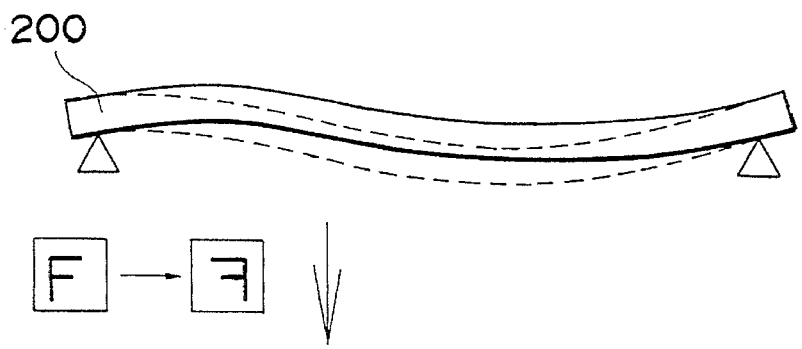
FIGS. 10A to 10D are explanatory diagrams each showing the way of obtaining the correction quantity to be stored in a memory.
Figure 10B:
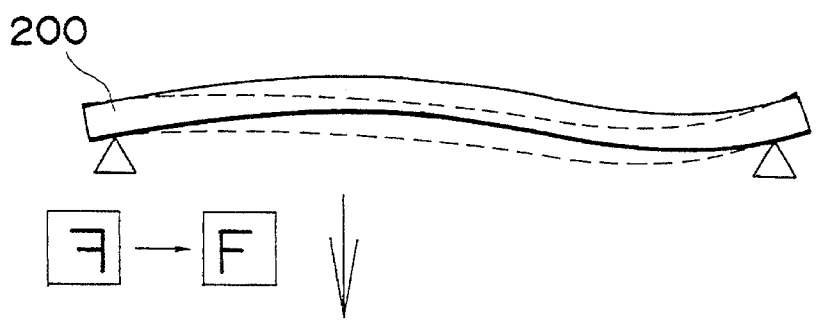
Figure 10C:
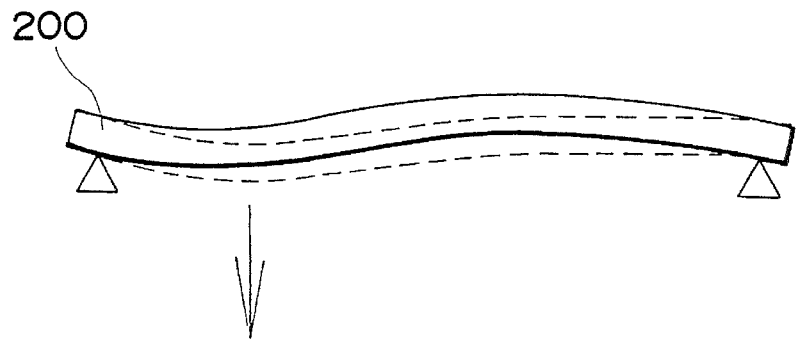
Figure 10D:
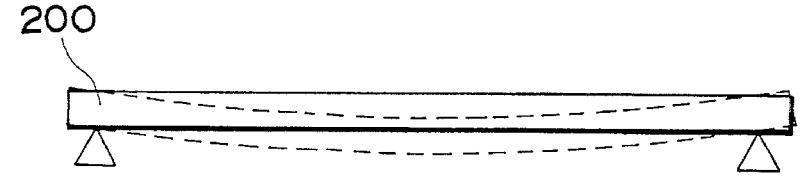
Figure 11:
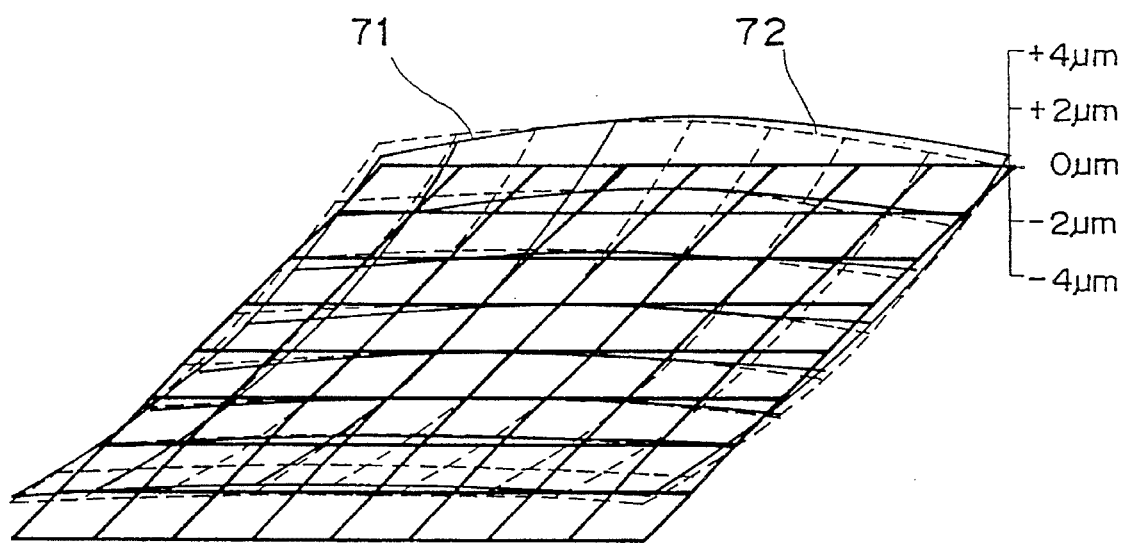
FIG. 11 is a diagram showing a comparison in terms of flexural configuration between two pieces of substrates each having the same material and shape.
Figure 12:
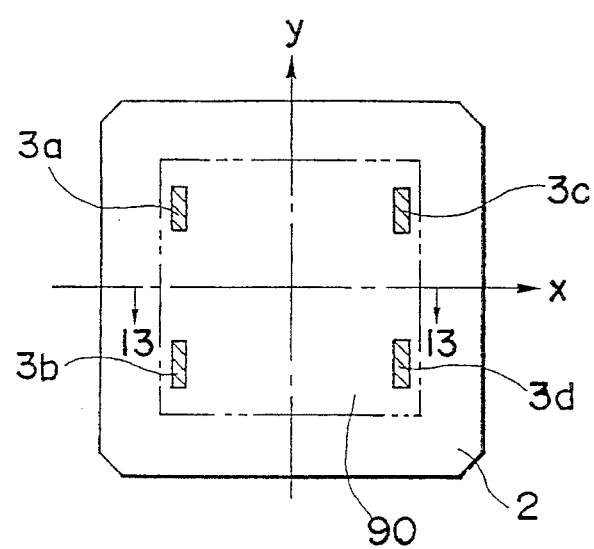
FIG. 12 is an enlarged view illustrating a stage of a conventional pattern position measuring apparatus.
Figure 13:
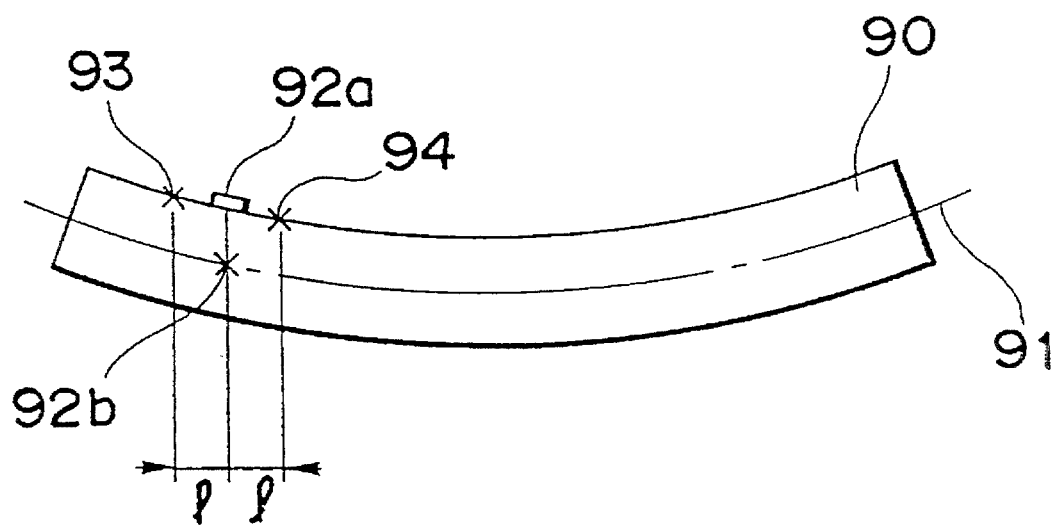
FIG. 13 is an explanatory diagram showing a method of correcting a flexure of the substrate in the conventional pattern position measuring apparatus.

Note that the reference substrate may be a deformed one as shown in FIGS. 10A and 10B.

Moreover, the correction quantities of a variety of substrates which are to be stored in the memory 22 are computed from an average of the flexural configurations of a plurality of reference substrates. An error due to a non-uniform thickness of the substrate can be thereby reduced.

Next, the operations of measuring the pattern positions of the measured substrate 10 will be explained.

The measured substrate 10 is supported on the stage 15, with its pattern forming surface being directed upward. The main control unit 20 controls, on receiving a measurement start instruction from an unillustrated input device, the actuator 150 to move the stage 15 to the initial position while monitoring positional signals transmitted from the interferometer systems 14a, 14b. As a result, the initial position on the substrate 10 is on the optical axis of the objective lens 11 of the optical device 12. Subsequently, the main control unit 20 controls the actuator 150 to move the stage 15 stepwise from the initial position. The substrate surface undergoes relative scanning by the spot beams emitted from the optical device 12. When the spot beams strike on the pattern edges of the substrate surface, thereby producing the scattered light. Edge detection signals are thereby inputted from the photodetectors 50a, 50b, 51a, 51b to the main control unit 20. The main control unit 20 reads positions of the pattern edges when the edge detection signals are inputted thereto from the interferometer systems 14a, 14b. The pattern positions read herein are those in a state where the pattern forming surface is shrunk. Then, the main control unit 20 reads, from the memory 22, the correction quantities in the areas where the pattern edge positions exist. The pattern edge positions (pattern positions) are corrected to pattern positions with no flexure. The measured pattern positions are indicated on the indicator 21.

In accordance with this embodiment, the correction quantities are set at the twenty five points on the substrate surface. If the number of positions for setting the correction quantities is increased, however, as a matter of course, a much more accurate correction can be made. It is to be noted that the materials and shapes of the measured substrate are limited, and, therefore, the correction quantities of plural kinds of substrates are easy to store.

In this embodiment, the correction quantities stored in the memory 22 are computed from the data about the flexural configurations of the surface and the underside of the reference substrate having the same material and shape as those of the measured substrate. The correction quantities may be obtained by calculations based on the finite element method.

Further, in accordance with the second embodiment discussed above, the memory 22 stores, as the correction quantities, the two-dimensional displacement quantities of the pattern positions that are attributed to the flexure by the tare weight in the state where the measured substrate is supported with its pattern forming surface being directed upward. In addition to these quantities, the memory 22 further stores, as second correction quantities, the two-dimensional displacement quantities of the pattern positions that are derived from the caused-by-tare-weight flexure when supported with its pattern forming surface being directed downward. It is thus possible to correct the pattern positions measured when supported with the pattern forming surface being set upward to the pattern positions when supported with the pattern forming surface being set downward.

As discussed above, the present invention provides the construction to store beforehand the two-dimensional displacement quantities of the pattern positions that are produced by the flexure due to the tare weight of the substrate assuming the same shape and material as those of the measured substrate. There is no necessity for obtaining the two-dimensional displacement quantities of the pattern positions by measuring the slopes of the substrate surface in the measuring positions each time as done in the prior art. The throughput can be thereby improved.

It is apparent that, in this invention, a wide range of different working modes can be formed based on the invention without deviating from the spirit and scope of the invention. This invention is not restricted by its specific working modes except being limited by the appended claims.

What is claimed is:

1. A pattern position measuring method of measuring two-dimensional positions of a pattern formed on a surface of a substrate to be measured, said method comprising:

a pattern position measuring step of measuring the positions of said pattern in a first flexural configuration produced in a supported state where said measured substrate is supported in a first plurality of positions of said measured substrate on a stage;

a flexural configuration detecting step of detecting said first flexural configuration of the surface of said measured substrate; and a correcting step of correcting said pattern positions in said first flexural configuration that are measured by said pattern position measuring step to pattern positions in a second flexural configuration based on the pattern positions in said first flexural configuration that are measured by the pattern position measuring step, said first flexural configuration detected by said flexural configuration detecting step and a previously stored second flexural configuration of the surface of said measured substrate which is produced when said measured substrate is supported in a second plurality of positions different from said first plurality of positions.

2. The pattern positions measuring method according to claim 1, wherein said first flexural configuration is a flexural configuration of the surface of said measured substrate that is produced when said measured substrate is supported on said stage with the measured substrate surface being directed upward, and said second flexural configuration is a flexural configuration of the surface of said measured substrate that is produced when said measured substrate is supported on said stage with the measured substrate surface being directed downward.

3. A pattern position measuring method of measuring two-dimensional positions of a pattern formed on a surface of a substrate to be measured, said method comprising:

a pattern position measuring step of measuring the positions of said pattern in a first flexural configuration produced in a supported state where said measured substrate is supported in a first plurality of positions of said measured substrate on a stage;

a flexural configuration detecting step of detecting said first flexural configuration of the surface of said measured substrate;

a storing step of storing a second flexural configuration of the surface of said measured substrate that is produced when said measured substrate is supported in a second plurality of positions different from said first plurality of positions; and a correcting step of correcting said pattern positions in said first flexural configuration that are measured by said pattern position measuring step to pattern positions in a second flexural configuration based on the pattern positions in said first flexural configuration that are measured by the pattern position measuring step, said first flexural configuration detected by said flexural configuration detecting step and said second flexural configuration stored by said storing step.

4. A pattern position measuring method of measuring two-dimensional positions of a pattern formed on a surface of a substrate to be measured, said method comprising:

a pattern position measuring step of measuring the positions of said pattern in a first flexural configuration produced in a supported state where said measured substrate is supported in a first plurality of positions of said measured substrate on a stage;

a flexural configuration detecting step of detecting said first flexural configuration of the surface of said measured substrate;

a first correcting step of correcting said pattern positions in said first flexural configuration to pattern positions in a flat state with no flexure based on said pattern positions in said first flexural configuration that are measured by said pattern position measuring step and said first flexural configuration detected by said flexural configuration detecting step; and a second correcting step of correcting said pattern positions in said flat state with no flexure that are obtained by said first correcting step to pattern positions in a second flexural configuration based on a previously stored second flexural configuration of the surface of said measured substrate which is produced when said measured substrate is supported in a second plurality of positions different from said first plurality of positions.

5. A pattern position measuring apparatus for measuring two-dimensional positions of a pattern formed on a surface of a substrate to be measured, said apparatus comprising:

pattern position measuring means for measuring said pattern positions in a first flexural configuration produced in a supported state where said measured substrate is supported in a first plurality of positions of said measured substrate on a stage;

flexural configuration detecting means for detecting said first flexural configuration of the surface of said measured substrate;

storing means for storing a second flexural configuration of the surface of said measured substrate that is produced when said measured substrate is supported in a second plurality of positions different from said first plurality of positions; and correcting means for correcting said pattern positions in said first flexural configuration that are measured by said pattern position measuring means to pattern positions in a second flexural configuration based on the pattern positions in said first flexural configuration that are measured by the pattern position measuring means, said first flexural configuration detected by said flexural configuration detecting means and said second flexural configuration stored in said storing means.

6. A pattern position measuring method of measuring two-dimensional positions of a pattern formed on a surface of a substrate to be measured, said method comprising:

a pattern position measuring step of measuring said two-dimensional positions of said pattern; and a correcting step of correcting said pattern positions measured by said pattern position measuring step to pattern positions in a state of causing no flexure by a tare weight in accordance with previously stored two-dimensional displacement quantities of said pattern positions that are produced by a flexure due to the tare weight of a reference substrate having the same material and shape as those of said measured substrate.

7. The pattern position measuring method according to claim 6, wherein said displacement quantities are set for a plurality of areas defined on the surface of said measured substrate, and said pattern positions measured by said pattern position measuring step are corrected by said displacement quantities set for said areas where respective patterns exist.

8. The pattern position measuring method according to claim 6, wherein said measured substrate is supported on substrate support parts provided in three positions on a stage.

9. A pattern position measuring method of measuring two-dimensional positions of a pattern formed on a surface of a measured substrate supported on a stage, said method comprising:

a first flexural configuration detecting step of detecting a flexural configuration of a surface of a reference substrate having the same material and shape as those of said measured substrate and supported on said stage with the surface of said reference substrate being directed upward;

a second flexural configuration detecting step of detecting a flexural configuration of an underside of said reference substrate supported on said stage with the underside of said reference substrate being directed upward;

a displacement quantity computing step of computing two-dimensional displacement quantities of pattern positions that are produced by a flexure caused by a tare weight of said reference substrate based on said flexure configuration of the surface of said reference substrate that is detected by said first flexural configuration detecting step and said flexural configuration of the underside of said reference substrate that is detected by said second flexural configuration detecting step;

a storing step of storing said displacement quantities computed by said displacement quantity computing step;

a pattern position measuring step of measuring said two-dimensional positions of said pattern formed on the surface of said measured substrate; and a correcting step of correcting said pattern positions measured by said pattern position measuring step to pattern positions in a state of causing no flexure due to the tare weight in accordance with said displacement quantities stored by said storing step.

10. The pattern position measuring method according to claim 9, wherein said displacement quantities are set for a plurality of areas defined on the surface of said measured substrate, and said pattern positions measured by said pattern position measuring step are corrected by said displacement quantities set for said areas where respective patterns exist.

11. The pattern position measuring method according to claim 9, wherein said measured substrate is supported on substrate support parts provided in three positions on said stage.

12. A pattern position measuring method of measuring two-dimensional positions of a pattern formed on a surface of a measured substrate, said method comprising:

a pattern position measuring step of measuring said two-dimensional positions of the pattern formed on the surface of said measured substrate; and a correcting step of correcting results measured by said pattern position measuring step based on previously stored two-dimensional displacement quantities of said pattern positions that are derived from a flexure due to a tare weight of a reference substrate when said reference substrate having the same material and shape as those of said measured substrate is supported with its pattern forming surface being directed upward, and previously stored two-dimensional displacement quantities of said pattern positions that are attributed to the flexure due to the tare weight when said reference substrate is supported with its pattern forming surface being directed downward.

13. The pattern position measuring method according to claim 12, wherein said pattern positions are measured in a supported state where said measured substrate is supported with its surface being directed upward in said pattern position measuring step, and the results measured by said pattern position measuring step are corrected to pattern positions in a supported state where said measured substrate is supported with its surface being directed downward by said correcting step.

14. The pattern position measuring method according to claim 12, wherein said pattern positions are measured in a supported state where said measured substrate is supported with its surface being directed downward by said pattern position measuring step, and the results measured by said pattern position measuring step are corrected to pattern positions in a supported state where said measured substrate is supported with its surface being directed upward by said correcting step.

15. The pattern position measuring method according to claim 12, wherein said displacement quantities are set for a plurality of areas defined on the surface of said measured substrate, and said pattern positions measured by said pattern position measuring step are corrected by said displacement quantities set for said areas where respective patterns exist.

16. The pattern position measuring method according to claim 12, wherein said measured substrate is supported on substrate support parts provided in three positions on a stage.

17. A pattern position measuring apparatus for measuring two-dimensional positions of a pattern formed on a surface of a substrate to be measured, said apparatus comprising:

pattern position measuring means for measuring said pattern positions;

storing means for storing two-dimensional displacement quantities of said pattern positions that are produced by a flexure due to a tare weight of a reference substrate having the same material and shape as those of said measured substrate; and a correcting means for correcting the measured pattern positions of said measured substrate in accordance with said displacement quantities stored in said storing means.

18. A pattern position measuring method of measuring two-dimensional positions of a pattern formed on a surface of a substrate to be measured, said method comprising:

a storing step of storing two-dimensional displacement quantities of said pattern positions that are produced by a flexure due to a tare weight of a reference substrate having the same material and shape as those of said measured substrate;

a pattern position measuring step of measuring said two-dimensional positions of said pattern; and a correcting step of correcting said pattern positions measured in said pattern position measuring step to pattern positions in a state of causing no flexure by the tare weight in accordance with said two-dimensional displacement quantities stored in said storing step.

19. A pattern position measuring method according to claim 18, wherein said displacement quantities are set for a plurality of areas on the surface of said measured substrate, and said pattern positions measured by said pattern position measuring step are corrected by said displacement quantities set for areas where respective patterns exist.

20. A pattern position measuring method according to claim 18, wherein said measured substrate is supported on substrate support parts provided in three positions on a stage.

\* \* \* \* \*